United States Patent [19]

Dhaka et al.

[11] 3,734,787

[45] May 22, 1973

[54] FABRICATION OF DIFFUSED JUNCTION CAPACITOR BY SIMULTANEOUS OUTDIFFUSION

[75] Inventors: Vir A. Dhaka; Walter F. Krolikowski, both of Hopewell Junction, N.Y.

[73] Assignee: International Business Machines Corporation, Armonk, N.Y.

[22] Filed: Jan. 9, 1970

[21] Appl. No.: 1,672

[52] U.S. Cl. ....................148/175, 29/576, 117/212, 148/187, 148/191, 317/235 R

[51] Int. Cl. ..........H01l 7/64, H01l 19/00, H01l 5/00

[58] Field of Search......................148/174, 175, 1.5, 148/187, 191; 117/201, 212; 29/569, 576; 317/234, 235

[56] References Cited

UNITED STATES PATENTS

| | | | |
|---|---|---|---|
| 3,260,902 | 7/1966 | Porter | 317/235 |
| 3,449,643 | 6/1969 | Imaizumi | 317/235 |
| 3,474,308 | 10/1969 | Kronlage | 148/175 X |
| 3,474,309 | 10/1969 | Stehlin | 317/235 |
| 3,502,951 | 3/1970 | Hunts | 317/235 |
| 3,617,827 | 11/1971 | Schmitz et al. | 317/235 |

FOREIGN PATENTS OR APPLICATIONS

| | | | |
|---|---|---|---|
| 1,541,490 | 10/1967 | France | 148/175 |

OTHER PUBLICATIONS

Gay et al., "Capacitors for Monolithic Integrated Circuits" S.C.P. and Solid State Tech. April 1966, p. 24–27.

Vora et al., "P–I–N Isolation for Monolithic Integrated Circuits" IEEE Trans on Electron Devices, Vol. ED–15, No. 9, Sept. 1968, p. 655–659.

Ashar et al., "Semiconductor Device Structure and Method of Making" I.B.M. Tech. Discl. Bull. Vol. 11, No. 11, April, 1969, P. 1529–1530.

*Primary Examiner*—L. Dewayne Rutledge
*Assistant Examiner*—W. B. Saba
*Attorney*—Sughrue, Rothwell, Mion, Zinn & Macpeak

[57] ABSTRACT

A diffused junction capacitor having two $P^+N^+$ junctions, one in the semiconductor substrate and one in an epitaxial layer thereon and exhibiting high capacitance per unit area.

A method for forming such a capacitor makes use of the fact that the outdiffusion rate for boron is much faster than the outdiffusion rate for arsenic, whereby, for instance, boron and arsenic diffused into the surface of a semiconductor wafer can, after the growth of an $N^-$ epitaxial layer, be diffused into the $N^-$ epitaxial layer. Since the boron outdiffuses much faster, it will cover a larger area than the arsenic outdiffusion. This will, in turn, result in two $P^+$-$N^+$ junctions, one in the substrate and one in the $N^-$ epitaxial layer.

10 Claims, 9 Drawing Figures

INVENTORS

BY Sughrue, Rothwell, Mion, Zinn & Macpeak

ATTORNEYS

FABRICATION OF DIFFUSED JUNCTION CAPACITOR BY SIMULTANEOUS OUTDIFFUSION

BACKGROUND OF THE INVENTION

1. Field of the Invention

The present invention relates to diffused junction capacitors and processes for forming the same.

2. Description of Prior Art

It is well known in the prior art to form variable capacitance diodes and the like utilizing diffusion techniques where, for instance, a P-N junction is formed by first diffusing a donor dopant into a substrate and thereafter diffusing an acceptor dopant into the substrate. For instance, as disclosed in U.S. Pat. No. 3,392,067, Horiba et al., an N-type region is first formed in a silicon substrate by diffusing bismuth into a silicon wafer. Thereafter, boron is diffused through the N-type region into the wafer until the surface density of the boron reaches a higher order of magnitude than the bismuth density, thus forming in the wafer a P-type region which, together with the N-type region, forms a hyper-abrupt junction.

This type of procedure, however, enables only the formation of a single P-N junction, and does not provide a process wherein separate isolation diffusion is not necessary.

The present invention overcomes both of the above faults of the prior art, provides a novel double diffused junction capacitor and a novel process for forming the same.

SUMMARY OF THE INVENTION

The present invention provides a novel method for constructing double-sided diffused junction capacitors, using, inter alia, two dopant impurities which have different outdiffusion rates in a semiconductor wafer.

Impurities of two different types, such as $N^+$ and $P^+$, are diffused into substrate wafer. These impurities must have different outdiffusion rates. As can be seen, if the $P^+$ impurity is diffused to a greater depth than the $N^+$ impurity, one $P^+$-$N^+$ junction will result. An epitaxial layer is then grown over the junction. The $N^+$ and the $P^+$ impurities are permitted to outdiffuse into this newly grown epitaxial layer, whereby the impurity which has a faster outdiffusion rate will cover a much larger volume than the impurity which has a slower outdiffusion rate. Assuming that the $P^+$ impurity has a faster outdiffusion rate, it will, by outdiffusing into a larger volume, provide a second $P^+$-$N^+$ junction.

The end result is a double diffused junction capacitor having a very high capacitance per unit area.

It is a further object of the present invention to provide a diffused junction capacitor wherein no separate isolation diffusion is necessary.

It is yet another object of the present invention to provide a capacitor exhibiting, in one embodiment, a reduced series resistance.

These and other objects of the present invention will become clearer upon a reading of the detailed description of the preferred embodiments, immediately following the material briefly describing the drawings.

DETAILED DESCRIPTION OF THE PREFERRED EMBODIMENTS

The present invention, as heretofore indicated, provides a novel method for forming a double diffused junction capacitor. The proposed method makes use of the outdiffussion rate of a $P^+$ impurity which must be faster than the outdiffusion rate of the $N^+$ impurity under consideration. One $P^+$-$N^+$ junction, is formed in the semiconductor substrate and a second $P^+$-$N^+$ junction is formed in an epitaxial layer grown on the substrate (hereinafter the term substrate shall be understood to mean a semiconductor substrate).

Before discussing the many embodiments of the present invention, the following specific example is offered, as an understanding of the invention will become easier thereafter. Reference should be made to the drawings in conjunction with the present discussion.

Figure 1:
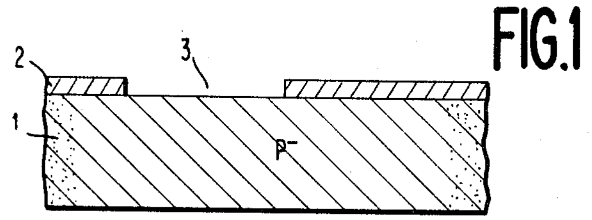
FIGS. 1–8 are schematics of a device being formed in accordance with the present invention.

In FIG. 1, a $P^-$ silicon semiconductor wafer or $P^-$ epitaxial layer on a given semiconductor substrate is covered with a thermally grown silicon dioxide layer. In the present instance, a $P^-$ wafer having the dimensions 8 mil thick, 1.25 inches in diameter is shown and designated as numeral 1. The thermally grown silicon dioxide layer is identified as numeral 2. The silicon dioxide layer can be formed by any state of the art techniques, such as by steam and oxygen oxidation or dry oxygen oxidation or deposition of oxide by pyrolitic techniques, etc. The $P^-$ wafer typically has a background doping concentration of about $2 \times 10^{15}$ atoms/cc or thereabouts, although this is substantially non-critical and meant to represent only state of the art values. The thickness of the thermally grown silicon dioxide layer is also not important and may typically be around the general area of 0.5 microns. In FIG. 1, an opening 3 is shown in the thermally grown silicon dioxide 2.

In the following description, the two impurity materials disclosed are boron and arsenic but the invention is not to be limited thereto, as will be hereinafter explained.

Figure 2:
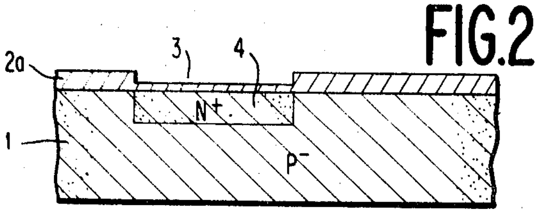

The second step in the processing scheme of the present invention is arsenic subcollector diffusion through opening 3. Typically, diffusion may be by any state of the art technique such as, for instance, open or closed tube techniques, and sources may be either powder, liquid, gaseous or paint-on types. In this instance, diffusion was carried out by closed tube techniques using a 1.5 atomic percent arsenic source. In this example, the arsenic diffusion was performed at a temperature of 1,105°C, to yield an arsenic $C_O$ of $1.4 \times 10^{21}$ atoms/cc. The depth of diffusion was 52 microinches. The arsenic subcollector 4 thus formed makes up the $N^+$ layer of the capacitor of the present invention. Arsenic subcollector diffusion can be immediately followed by oxidation such as thermal oxidation in the presence of steam and oxygen to yield thermally grown oxide film 2*a*. and the assembly at this time is shown in FIG. 2.

Figure 3:
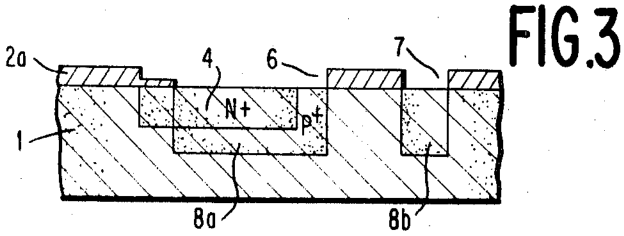

The third step of the present invention is to make openings for the $P^+$ layer of the capacitor and an opening for isolation, identified respectively as 6 and 7 in FIG. 3. Boron diffusion is then conducted, the boron $C_O$ being made to be less than the arsenic $C_O$. FIG. 3 illustrates the assembly of the present invention immediately after boron diffusion. The boron, or $P^+$, area is represented by numeral 8*a* for the capacitor and 8*b* for the isolation. Boron diffusions can be conducted by closed or open tube techniques using powder, liquid or gaseous sources. Boron diffusion was conducted in this instance by a closed tube technique using a powder boron source at 1,105°C to a $C_O = 4.2 \times 10^{20}$. Boron diffusion was to a depth of 110 microinches, and the final depth was about 55 microinches deeper into the substrate 1 than the arsenic diffusion. The $C_O$ of the boron, or $P^+$, impurity was $4.2 \times 10^{20}$. It is important that the boron $C_O$ be less than the arsenic $C_O$ otherwise no $P^+$ $N^+$ junction will be formed.

Figure 4:
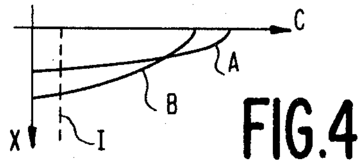

FIG. 4 illustrates the concentration relationship between the $P^-$ wafer, the $N^+$ arsenic impurity, and the $P^-$ boron impurity. In FIG. 4, line A represents the $N^+$ impurity concentration, line B represents the $P^+$ impurity concentration, and line I represents the background impurity concentration. C is the impurity concentration, and X is the diffusion depth into the $P^-$wafer or epi.

Reference to both FIGS. 3 and 4 will make it clear that the boron is made to diffuse to a much greater extent into the wafer substrate than the arsenic.

The next step in the present invention is to remove the oxide layer 2*a*, for instance, by etching with HF (hydrofluoric acid), and to deposit an $N^-$ silicon epitaxial layer. This $N^-$ silicon epitaxial layer can be deposited by any standard state of the art epitaxial deposition technique. The thickness of the $N^-$ epitaxial layer was 2 $\mu$. In this example, the $N^-$ silicon epitaxial layer gets arsenic doped due to outgassing of arsenic from $N^+$ arsenic diffused regions in the substrate, and deposited at 1,150°C to a thickness of 2.0 microns.

Figure 5:
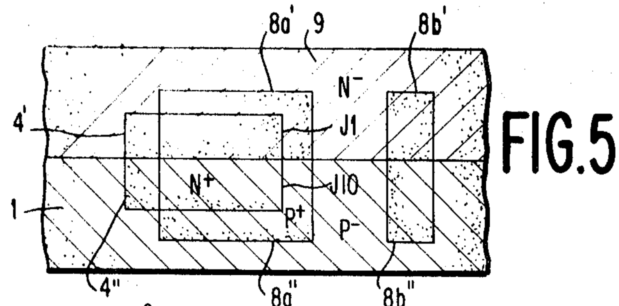

Outdiffusion occurs during deposition of the $N^-$ epitaxial layer because growth is at elevated temperatures. Reference should now be made to FIG. 5, which schematically shows the assembly of the present invention immediately after deposition of the $N^-$ epitaxial layer 9 and the simultaneous outdiffusion which occurs therewith.

It can be seen that the $P^+$ boron has outdiffused into the $N^-$ epitaxial layer to a much greater degree than the $N^+$ arsenic. The outer limits of the boron zone are now identified as 8*a'* and 8*a''* for the capacitor junction, and 8*b'* and 8*b''* for the isolated diffusion. In contradistinction, the new boundaries of the arsenic diffused zone are identified as 4' and 4''. Since the boron has diffused to a much greater extent into the epitaxial layer 9 than the arsenic, a second capacitor junction is formed in the epitaxial layer 9. The junction in the epitaxial layer is identified as J1 whereas the "original" junction in the substrate 1 is identified as J10. It will be appreciated, of course, that the junction J10 in the substrate 1 is somewhat altered after deposition of the $N^-$ epitaxial layer 9 from the position this "original" junction had before $N^-$ epitaxial deposition and outdiffusion.

Figure 6:
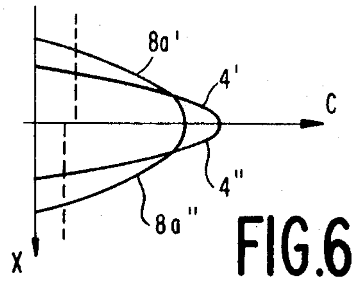

FIG. 6 shows the impurity profile for the double junction capacitor at this point.

Figure 7:
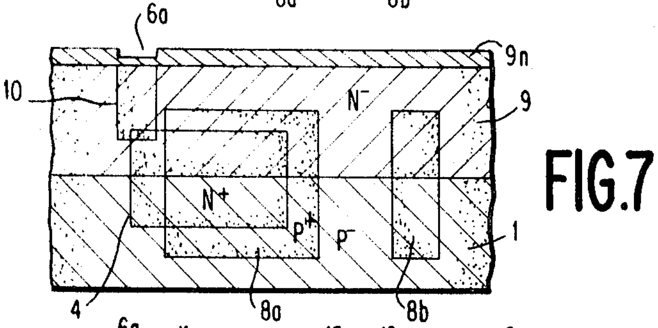

The next step, to realize a practical device, is to oxidize the $N^-$ epitaxial layer and form oxidized layer 9*n*. Openings are made for $N^+$ capacitor contact at the same time as openings are made for contact to the arsenic subcollector. The assembly, after $N^-$ channel diffusion with phosphorus and oxidation is shown in FIG. 7 of the drawings. The phosphorous or $N^-$ channel is identified in FIG. 7 by numeral 10 and its contact with the $N^+$ or arsenic layer 4 is readily visible. Immediately after $N^-$ channel diffusion, oxidation is conducted to "close" the opening 6*a* in the thermally grown silicon dioxide layer 9*n*. It will be appreciated that other impurities, in addition to or instead of phosphorous, may be used, for instance, arsenic. In the present example, phosphorous diffusion was at 1,050°C to a $C_O = 4 \times 10^{19}$ atoms/cc to obtain a junction depth of 1 $\mu$. Phosphorous diffusion has no significant further affect upon "spreading" the boundaries of the $P^+$ -$N^+$ layers, the process being non-critical in this respect. Of course, at very high temperatures or very long times some spreading would be encountered.

Figure 8:
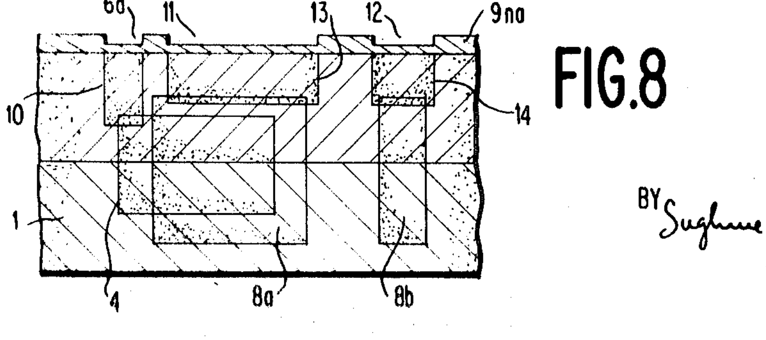

The next step in the present invention is to open holes in the newly "reoxidized" layer 9*n* for $P^+$ capacitor contact and isolation. At the same time, openings for base contacts are made. The opening 11 over the capacitor section per se covers nearly the entire area of the capacitor. This is done to reduce the series resistance of the outdiffused $P^+$ layer. At this time, reference should be made to FIG. 8 which shows the double diffused junction capacitor of the present invention after base diffusion and oxidation. The former "hole" for $P^+$ capacitor contact in the newly oxidized layer 9*na* is shown by numeral 11, and the former hole for isolation is shown by numeral 12. The capacitor structure and isolation are now substantially complete, except for the formation of ohmic contacts thereon. With reference to FIG. 8, the base diffusion to the $P^+$ capacitor area is denoted by numeral 13, and to the isolation zone by numeral 14. These diffusions were, respectively, both a boron (base) diffusion to contact the $P^+$ capacitor layer and the isolated diffused zone 8*b*. Base diffusion is performed by any of the well known high temperature techniques. In the present instance, boron diffusion occured at 1,050°C to yield a boron $C_O$ of $3 \times 10^{19}$ at/cc.

The next diffusion to occur is, of course, well known to those skilled in the art and comprises an emitter diffusion. This is not shown in the drawings nor described at this point. This diffusion could be arsenic or phosphorus diffusion at $C_O = 1 \times 10^{21}$ or so and can be done in the temperature range of 900°–1,100°C or so.

Openings to the capacitor will now be made, and at the same time, openings would be made to the emitter, base, etc. areas. Using any standard state of the art technique, ohmic metal contacts could then be made to the capacitor structure and the isolation.

This, in substance, completes the novel double diffused junction capacitor of the present invention.

Figure 9:
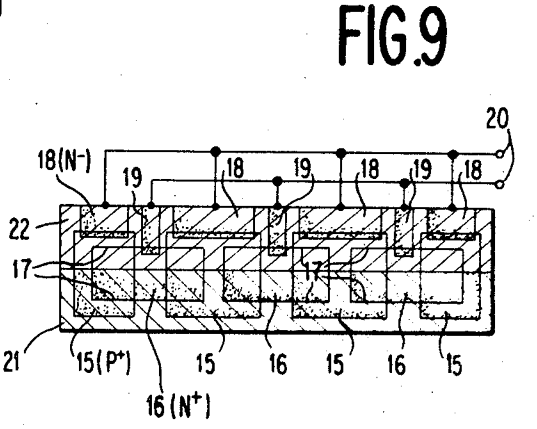
FIG. 9 is a schematic of a device produced according to this invention illustrating very low series resistance.

It will be obvious to one skilled in the art that, as shown in FIG. 9, a series of "fingered" parallel structures could be provided to reduce series resistance to the very thin $P^+$ and $N^+$ layers. This particular configuration offers substantial advantages in reducing series resistance for instance to values in the general area of 0.1 ohm for a $P^+$ contact area of a square mil or so.

In the novel configuration as shown in FIG. 9, the $P^+$ areas completely isolate the $N^+$ layer from the $N^-$ epitaxial layer. In FIG. 9, the basic configuration of the device is in accordance with the heretofore offered explanation. Specifically, the $P^+$ zones are represented by 15, the $N^+$ zones by 16, the junctions by 17, the $N^-$ channel diffusions by 19 and the base diffusion to the $P^+$ capacitor by numeral 18. The leads are shown by numeral 20, the substrate by 21 and the $N^-$ epitaxial layer by 22.

The above process offers a double diffused junction capacitor wherein no separate isolation diffusion is necessary. And wherein a capacitor is provided with two $P^+$-$N^+$ junctions, thereby providing an extremely high capacitance per unit area.

As will be obvious to one skilled in the art, the sequence of arsenic diffusion and boron diffusion could be reversed and still be within the essential concepts of the present invention.

Further, the $P^+$ impurity of the present invention has been identified as boron. Obviously, any $P^+$ impurity can be utilized as long as the outdiffusion rate is greater than the $N^+$ impurity used in combination therewith. Of course, the same reasoning applies to the $N^+$ impurity, that is, any $N^+$ impurity can be utilized as long as it illustrates an outdiffusion rate less than the $P^+$ impurity.

In the present invention, the concentration of the $N^+$ and $P^+$ impurities is generally within the range of $10^{20}$ to $2 \times 10^{21}$ at/cc, but this is not critical.

Further, the semiconductor substrate wafer used forms no essential part of the present invention. In the example, the substrate impurity was, of course, boron. In the present invention the substrate had a $P^-$ characteristic. Depending upon the needs of the compatible components in the same substrates, the substrate could be $P^+$ with $10^{17}$ at/cc or so.

As will be apparent, the greater the difference in outdiffusion rates between the two impurities used, the closer together will be the junctions. For instance, in the present example, the two junctions were approximately 2 microns apart.

It is important that the depth of diffusion for both the $P^+$ and $N^+$ impurities be substantially uniform. This is so that the junction J1 or J10 will be sharp and well-defined and occur at a uniform depth.

No criticality is attached to the exact difference in diffusion constants which the $N^+$ and $P^+$ impurity must realize. Generally, and most preferably, the outdiffusion rate of the two materials must differ by factor of 10. Of course, depending on the desired end result, a lower difference in the outdiffusion rates can be perfectly acceptable, as can much higher outdiffusion rates.

The temperature of outdiffusion is, of course, substantially non-critical and will depend upon the individual pairs of materials utilized. In the present instance, it was 1,150°C.

Further, in the example, an $N^-$ epitaxial layer was disclosed. A $P^-$ epitaxy could be utilized where it is not a disadvantage to have the $P^+$ end of the capacitor connected to the substrate $P^-$ material.

The depth of diffusion is not important, except insofar as an operable device is obtained. Typically, diffusion is to a depth of 1 to 2 microns with the outdiffusion into the epitaxy layer being 1 to 1.5 microns.

One particular advantage of the processing scheme of this invention is the case where NPN transistors are constructed by the sequence immediately heretofore described. The advantages will become apparent, since no extra steps are needed to form the capacitor in accordance with the present invention. First, a $P^-$ semiconductor wafer or $P^-$ epitaxial layer is subjected to subcollector diffusion and an isolation diffusion, an $N^-$ epitaxial layer is grown thereon, isolation diffusion is conducted, and $N^-$ channel diffusion for subcollector contact is performed. Next, base diffusion is performed followed by emitter diffusion. In the method of this invention, an additional $P^+$ diffusion into the $P^-$ substrate is necessary to make contacts, but, it should be noted that a separate isolation diffusion is not necessary whatsoever. Accordingly, the total number of steps is unchanged and yet a double junction diffused capacitor is obtained.

A further description of the various standard state of the art processing steps such as diffusion, epitaxy formation, etc. is offered in the following citations, and reference should be made thereto. "Integrated Circuits, Design Principles and Fabrication", Motorola Series in Solid State Electronics, McGraw-Hill, 1965, Chapter 3, Pages 69–94 for diffusion discussion and Chapter 5, Pages 127–165 for fabricating integrated structures. Subcollector formation processes are discussed at Page 189 and epitaxial growth is discussed on page 284.

From the heretofore offered description, it will be apparent that in the embodiment described, a semiconductor substrate as the term is commonly known in the art is used. This "substrate" can itself be an epitaxial layer on, e.g., a silicon slice, or on another epitaxial layer, etc. The possible combinations will be numerous, and well within the skill of the art.

While the invention has been particularly shown and described with reference to a preferred embodiment thereof, it will be understood by those skilled in the art that various changes in form and details may be made therein without departing from the spirit and scope of the invention.

What is claimed is:

1. A process for forming a double diffused junction capacitor which comprises:
   - forming a $N^+$ diffused zone in a P type semiconductor substrate;
   - forming a $P^+$ diffused zone in said substrate overlapping said $N^+$ diffused zone and to a depth greater than said $N^+$ zone, the surface concentration of said $P^+$ impurity being less than the concentration of said $N^+$ impurity;
   - growing an epitaxial layer on said substrate;
   - outdiffusing said $N^+$ and said $P^+$ impurity into said epitaxial layer, said $P^+$ impurity having a greater diffusion constant than said $N^+$ impurity, whereby a $P^+N^+$ junction is formed in said substrate and in said epitaxial layer; and
   - making separate electrical contact to said $P^+$ zone and said $N^+$ zone to form said capacitor.

2. The process of claim 1 wherein said outdiffusion occurs simultaneously with the growth of said epitaxial layer upon said substrate.

3. The process of claim 1 wherein said $P^+$ impurity has a rate of diffusion greater than said $N^+$ impurity by a factor of at least about 10.

4. The process of claim 1 wherein said $N^+$ diffused zone is formed in said semiconductor substrate to a depth of about 1 to about 2 microns, and said $P^+$ diffused zone is formed in said substrate to a depth within the range of about 1 to about 2 microns, said $P^+$ diffused zone being deeper in said substrate than said $N^+$ diffused zone.

5. The process of claim 4 wherein said outdiffusion is performed into said epitaxy layer to a depth of from about 1 to about 1.5 microns.

6. The process of claim 1 wherein the said $P^+$ diffused zone is formed prior to forming said $N^+$ diffused zone.

7. The process of claim 1 wherein the said separate electrical contact to said $P^+$ zone and said $N^+$ zone are made by diffusion reach-throughs in said substrate.

8. A process of forming a self-isolated double diffused junction capacitor comprising:

forming a $N^+$ diffused zone in a P type semiconductor substrate, said diffused zone having a major surface at the surface of the semiconductor substrate and also having side surfaces within said substrate substantially perpendicular to said major surface;

forming a $P^+$ diffused zone in said substrate overlapping the entire side surfaces and a portion of said major surface of said $N^+$ diffused zone in said substrate and to a depth greater than said $N^+$ zone, the surface concentration of said $P^+$ impurity being less than the concentration of said $N^+$ impurity;

growing an epitaxial layer on said substrate;

outdiffusing said $N^+$ and said $P^+$ impurity into said epitaxial layer, said $P^+$ impurity having a greater diffusion constant than said $N^+$ impurity whereby a $P^+N^+$ junction is formed in said substrate and in said epitaxial layer; and making separate electrical contact to said $P^+$ zone and said $N^+$ zone to form said capacitor.

9. The process of claim 8 wherein said $N^+$ diffused zone contains arsenic dopant and said $P^+$ diffused zone contains boron dopant.

10. The process of claim 8 wherein the said $P^+$ diffused zone is formed prior to forming said $N^+$ diffused zone.

* * * * *